United States Patent [19]

Williams et al.

[11] Patent Number: 5,510,155
[45] Date of Patent: Apr. 23, 1996

[54] METHOD TO REDUCED GAS TRANSMISSION

[75] Inventors: Joel L. Williams, Cary, N.C.; Susan L. Burkett, Northport, Ala.; Shel McGuire, Omaha, Nebr.

[73] Assignee: Becton, Dickinson and Company, Franklin Lakes, N.J.

[21] Appl. No.: 301,101

[22] Filed: Sep. 6, 1994

[51] Int. Cl.$^6$ ........................................... B05D 3/00
[52] U.S. Cl. .................. 427/532; 427/255.4; 427/322; 427/397.7; 427/399; 427/536; 427/551; 427/579; 427/595
[58] Field of Search .................. 427/551, 595, 427/532, 536, 579, 255.4, 322, 397.7, 399

[56] References Cited

U.S. PATENT DOCUMENTS

| | | | |
|---|---|---|---|
| 4,552,791 | 11/1995 | Hahn | 428/35 |
| 5,047,131 | 9/1991 | Wolfe et al. | 204/192.23 |

FOREIGN PATENT DOCUMENTS

0469926A1   8/1991   European Pat. Off. .

*Primary Examiner*—Bernard Pianalto
*Attorney, Agent, or Firm*—Richard E. Brown

[57] ABSTRACT

An irradiated plastic article of reduced gas transmission has a coating of silicon oxide on a surface thereof. A method to reduce gas transmission through a plastic article includes depositing a coating of silicon oxide thereon and irradiating, either prior to or subsequent to depositing the silicon oxide.

4 Claims, 8 Drawing Sheets

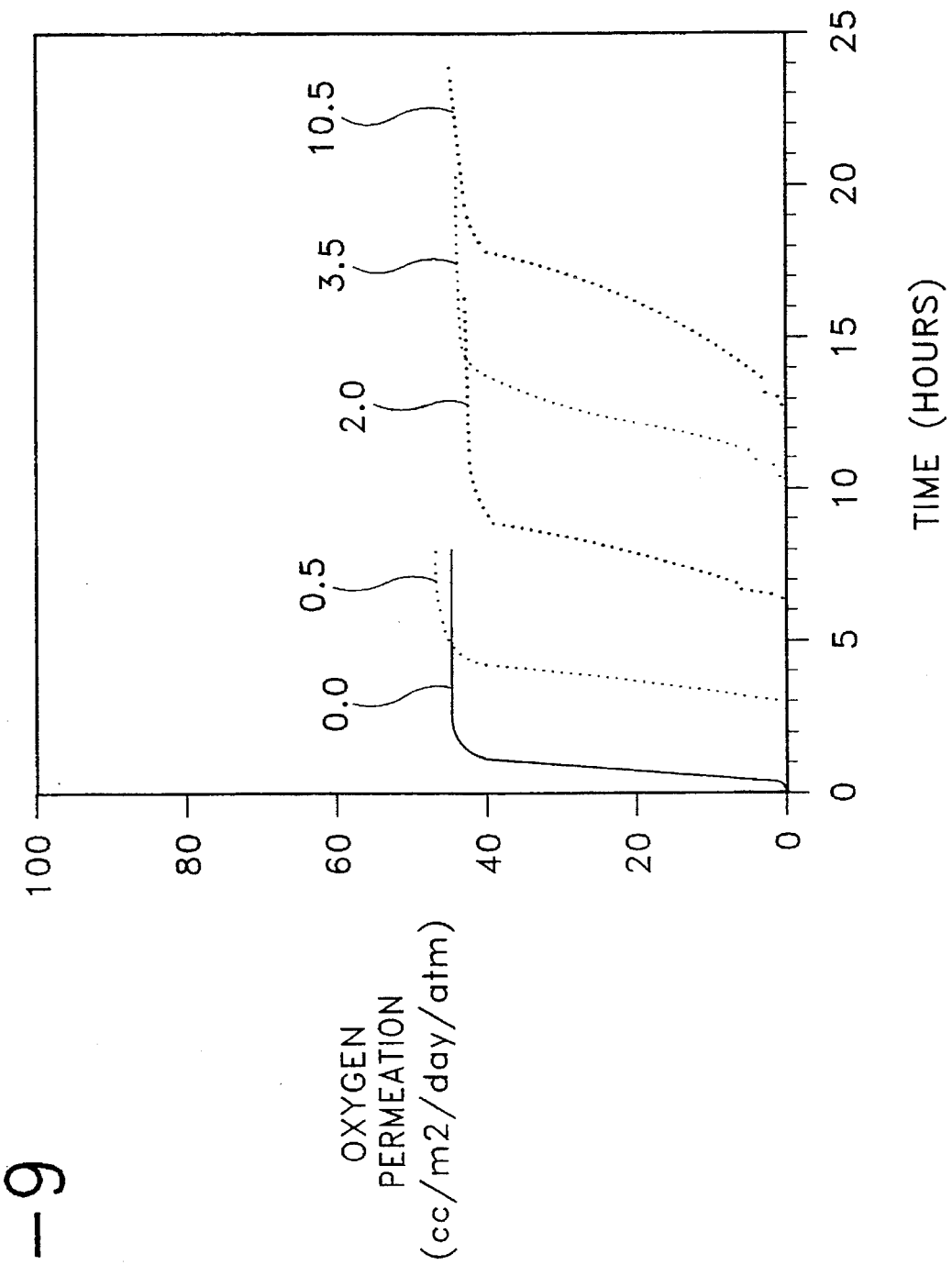

METHOD TO REDUCED GAS TRANSMISSION

BACKGROUND OF THE INVENTION

1. Field of the Invention

This invention relates to plastic articles, and more particularly relates to plastic containers of reduced gas permeation and method therefor.

2. Background

In the food, beverage and medical industries, thermoplastic polymers have come to the fore as preferred materials for manufacture of various articles and have largely replaced glass and metal. Polymer molecules are, however, large and the surfaces of shaped plastic articles are somewhat porous. As a result, plastic soft drink bottles require protection against loss of carbonation due to permeation of carbon dioxide through the container walls. On the other hand, food containers require protection against the ingress of air and water vapor and spoilage therefrom.

A recent approach to improving gas transmission properties for plastic containers is based on plasma deposition of a thin film of a silicon oxide ($SiO_x$) material on the container surface. Representative disclosures of this technology may be found in U.S. Pat. No. 4,552,791 to Hahn, 5,047,131 to Wolfe et al. and EP published application 469,926 to Felts.

In the medical arts, plastic, in particular polyolefin, is used for the manufacture of a wide variety of articles, such as for example, syringes, flasks, vials and tubes. Many of these articles must be sterilized, after which they spend an indeterminate period of time on the shelf before use.

It is well known that conventional sterilization by high energy irradiation causes plastics, in particular polyolefins, to discolor and become embrittled upon exposure to high energy radiation at levels above 0.1 megarads. As a result, much effort has been expended toward additives which would stabilize polyolefins toward irradiation degradation. This technology is summmarized in U.S. Pat. No. 4,959,402 to Williams et al.

While the above disclosures have individually addressed the problems of reducing gas transmission and reducing polymer degradation, there is a definite need in the packaging and medical arts for radiation sterilized articles of still greater imperviousness to oxygen transmission. The present invention fulfills this need.

SUMMARY OF THE INVENTION

A plastic article of reduced gas transmission has a coating thereon which reduces passage of air, oxygen, carbon dioxide and water vapor through the plastic. In addition, the article has been irradiated with high energy radiation, either prior to or subsequent to applying the coating.

The preferred plastic is either polyethylene terephthalate (PET) or polypropylene (PP) and the preferred coating is $SiO_x$. Preferred articles are beverage bottles and sample collection tubes.

Another aspect of the invention is a method to reduce gas transmission by irradiating a plastic article. The preferred method includes the steps of depositing a permeability-limiting coating on the surface of the article and irradiating. The depositing and irradiating steps may be done in any order, preferably in the sequence named.

Thus the invention provides a method for reducing gas transmission to levels which are not achieved by deposition of low permeability coatings alone. In addition, the radiation improves shelf life and may provide sterilization of the article. Since radiation sterilization is known in the art to cause degradation of the plastic over time due to radicals generated by the radiation, the invention converts a detriment to an attribute by using the radicals to react with incoming gas.

BRIEF DESCRIPTION OF THE DRAWINGS

FIGS. 7 to 9 are plots showing the effect of irradiation on oxygen transmission through films of polyamide, polyvinylidene chloride (PVDC) and PVC respectively in the absence of barrier.

DETAILED DESCRIPTION

While this invention is satisfied by embodiments in many different forms, there will herein be described in detail preferred embodiments of the invention, with the understanding that the present disclosure is to be considered as exemplary of the principles of the invention and is not intended to limit the invention to the embodiments illustrated and described. The scope of the invention will be measured by the appended claims and their equivalents.

The plastic article of the invention may be any article which would benefit from reduced gas transmission in its end use. The present disclosure contemplates reduced transmission of any gas, of which air, oxygen and carbon dioxide are the most pertinent. A representative but not limiting list of such articles includes films for packaging, containers such as bottles for storing liquids and medical devices contemplated for irradiation sterilization such as syringes, tubing, vials and tubes. The most preferred articles are soft drink bottles and devices, such as evacuated blood collection tubes, which are particularly susceptible to gas transmission due to the pressure differential across the article wall.

The articles of the invention, because of the barrier and the irradiation, also benefit from prolonged shelf life. Traditional glass tubes have an almost unlimited shelf life because glass is virtually impermeable to transmission of air and water vapor. Evacuated plastic blood collection tubes, onto other hand, are subject to variable loss of vacuum on the shelf because plastic does not have the impermeability of glass. Loss of vacuum, of course, reduces the blood volume collected and can markedly affect the result of blood analysis which depend on an accurate blood draw.

The article of the invention may be made of any plastic such as PVC, PET, polyethylene naphthalate, polystyrene, polycarbonate, polyester, polyolefin, PVDC and polyamide. Preferred plastics are PET and polyolefins such as polyethylene and, most preferably, PP. The plastic may be shaped into the article by any conventional technique such as molding or extruding.

While the invention contemplates any plastic article of reduced gas transmission, the invention will be described in terms of the preferred evacuated sample collection tube of polypropylene with the understanding that the elements which provide reduced gas transmission to the sample collection tube described in detail may equally well be applied to any other plastic article.

Figure 1:
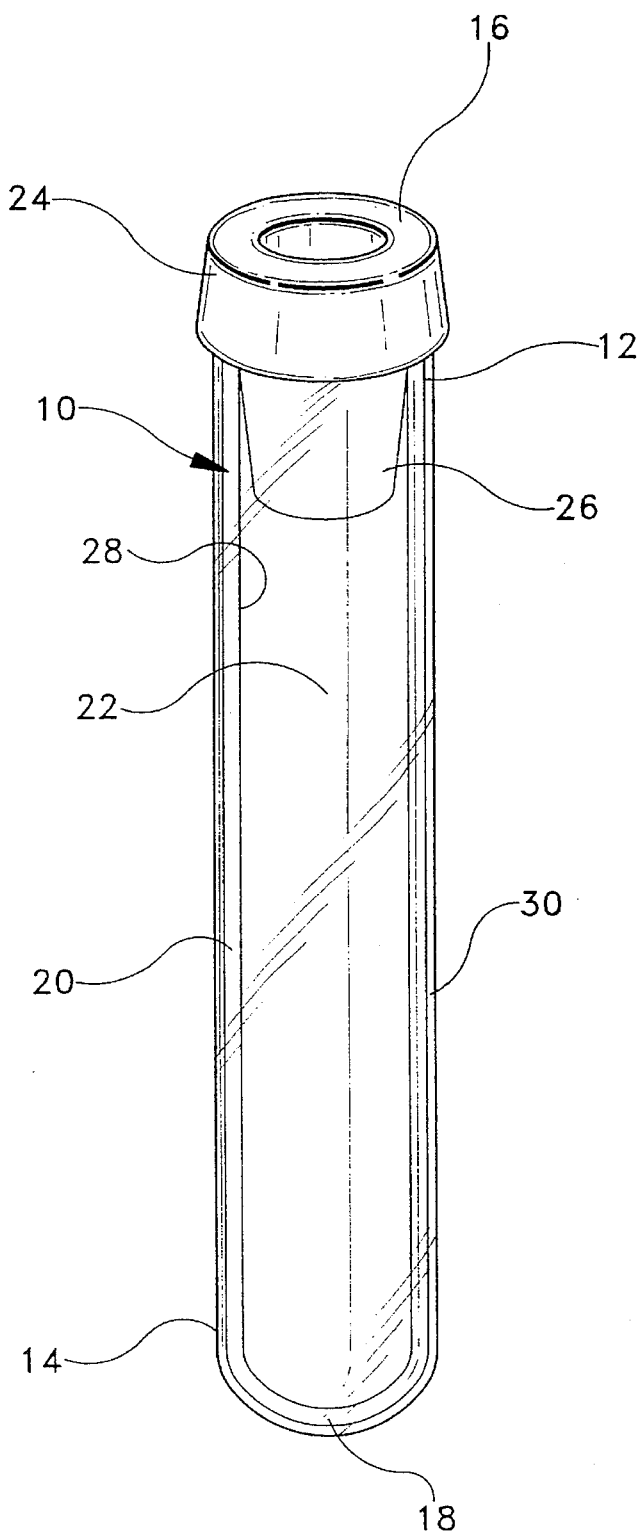
FIG. 1 is a perspective view of a blood collection assembly of the invention.

FIG. 1 illustrates a blood collection tube 10 of the invention having an open end 12, a closed end 14 and a stopper 16 in open end 12. Tube 10 has a bottom wall 18 defining the closed end and a side wall 20. Bottom wall 18, side wall 20 and stopper 16 enclose an interior volume 22 of the tube which preferably is evacuated. Stopper 16 preferably is puncturable by a needle or cannula and includes an upper annular portion 24 and a lower annular portion or skirt 26 which extends into and presses against the inside wall surface 28 of side wall 20 to maintain stopper 16 in place. A coating 30 of $SiO_x$ covers side wall 20 and bottom wall 18.

Puncturable stoppers for evacuated sample collection tubes are standard in the art and may be made of any suitable material, such as KRATON™ (styrene-butadiene copolymer).

The polyolefin preferably is of narrow molecular weight distribution. The molecular weight distribution of a polymer is defined by the ratio of the weight average molecular weight (Mw) and the number average molecular weight (bin) wherein the minimum possible ratio of 1.0 defines a polymer having all the chains the same size. Suitable polyolefins for the composition of the invention may have a number average molecular weight of about 10,000 to 400,000, preferably 30,000 to 180,000 and a ratio of from 1 to 9 preferably 2 to 6 as determined by conventional gel permeation chromatography. Most preferably the ratio is 2 to 4.

In addition to being of narrow molecular weight distribution, the preferred polyolefin is semicrystalline, and has a crystalline content of about 20 to 90, preferably about 40 to 80, most preferably about 45 to 65 percent. The degree of crystallinity is linearly proportional to the density of the sample and, as known in the art, may be measured with a conventional density gradient column.

The polyolefin of the invention may optionally include conventional stabilizing and clarifying additives. A low molecular weight noncrystalline substance which is miscible with the polymeric material and which is also compatible therewith, i.e., does not adversely affect the properties of the polymer, may be included. This additive, known in the art as a mobilizing oil, increases the mobility of the polymer. In general, such mobilizers have a density of from 0.6 to 1.9 g/cm³ preferably from 0.6 to 1.1 g/cm³. The mobilizer preferably has a low molecular weight, with the average molecular weight generally being in order of from 100 to 10,000, most preferably from 100 to 5,000.

Representative examples of suitable mobilizers are hydrocarbon oils, halogenated hydrocarbon oils, phthalic ester oils, vegetable oils, silicon oils, low molecular weight noncrystalline polymer greases, such as hydrocarbon polymer greases, low molecular weight polyester greases, polyarylether greases, etc. It is to be understood that the above examples are only illustrative and the use of other mobilizers should be apparent to one skilled in the art from the teaching herein. The preferred mobilizer is a liquid which is not highly viscous, most preferably a hydrocarbon oil or a phthalic ester oil.

The mobilizing additive may be incorporated into the composition in a mobilizing amount, generally about 0.1 to 50, preferably about 1 to 20 percent by weight.

A second optional radiation stabilizing additive may be a conventional hindered amine, preferably a hindered piperidine. Any of the hindered amine stabilizers as known in the art and described in U.S. Pat. No. 4,959,402 may be used. About 0.01 to 5.0, preferably abut 0.05 to 3.0 percent by weight of hindered amine may be used.

The clarifying additive of the present invention may be a conventional dibenzylidene sorbitol. Clarifying properties are conferred when the additive of the invention is formulated into the polyolefin composition in a quantity within the range of about 0.005 to 0.5, most preferably about 0.1 to 0.3 percent by weight. Dibenzylidene sorbitol clarifying agents for polyolefins are well known in the art fully described in the aforementioned U.S. Pat. No. 4,959,402 and no further details with respect to this aspect of this invention are needed for a full understanding of the invention.

Other additives as known in the art may be added to provide other desirable properties to the compositions. For example, fillers, coloring agents, antistatic materials, wetting agents, antiacids, and the like may be added in suitable quantities providing no deleterious effects in the desired physical properties, clarity or radiation stability are introduced. In addition, other known clarifying additives as for example, organic acids and metal salts thereof, such as para-t-butylbenzioc acid, may be incorporated into the composition.

Preparation of the polymer composition of the invention from its constituent parts is routine and may be carried out by any conventional mixing means. Generally, polyolefin pellets and the additives are thoroughly mixed by stirring or tumbling, the mixture melted and the melt pelletized and molded into the shape of the desired article.

The polymeric article has a coating of a gas transmission limiting material thereon. The coating may be of a polymer having a low gas permeability such as PVDC, epoxy resin, polyvinyl alcohol or PVC. Polymeric coatings may conveniently be applied by conventional solution coating. In solution coating, the coating polymer may be dissolved in a solvent and the article dip coated, or the solvent solution or polymer may be sprayed onto the article. Preferably, an inorganic coating such as aluminum oxide or high density carbon, either amorphous or diamond, or, most preferably, $SiO_x$ may be applied to the article surface. Aluminum oxide may be deposited conventionally by vaporizing and condensing on the article surface.

Deposition of amorphous carbon and $SiO_x$ may be done by conventional plasma deposition in which the article surface is exposed to a glow discharge plasma formed in the chamber of a conventional plasma generator. For amorphous carbon deposition, a plasma may be generated from methane. For $SiO_x$ deposition, the plasma may be generated from a gas stream containing an organosilicon compound, oxygen and an inert gas.

The organosilicon compound for the gas stream preferably is liquid at ambient temperature. A representative but non-limiting list of suitable compounds includes methylsilane, dimethysilane, trimethylsilane, diethylsilane, propylsilane, phenylsilane, hexamethyldisilane, 1,1,2,2-tetramethyl disilane, bis (trimethylsilane) methane, bis (dimethylsilyl) methane, hexamethyldisiloxane, vinyl trimethoxy silane, vinyl triethoxy silane, ethylmethoxy silane, ethyltrimethoxy silane, divinyltetramethyldisiloxane, divinylhexamethyltrisiloxane, and trivinylpentamethyltrisiloxazane. Preferred organosilicon compounds are 1,1,3,3-tetramethyldisiloxane, hexamethyldisiloxane, vinyltrimethylsilane, methyltrimethoxysilane, vinyltrimethoxysilane, trimethlsilane and hexamethyldisilazane.

The inert gas may be, for example, helium or argon, preferably helium.

The organosilicon compound may be volatilized and combined with the inert gas and oxygen prior to being flowed into the plasma chamber. Flow controllers may advantageously be used to adjustably control the flow rates of the individual gases entering the gas stream. While any desired flow rate ratio of the organosilicon compound, inert gas and oxygen may be used, a preferred ratio is about 1 to 1.8 to 1.5.

Any conventional plasma generator as known in the art may be used. A typical plasma generator consists of a reaction chamber, a high frequency generator and matching network, gas delivery system, high vacuum system and temperature controllers. A wide range of power setting, radio frequency, gas stream pressure, temperature and duration of exposure may be used to generate the plasma. Ranges for these parameters which provide advantageous results are DC or AC power levels up to 1000 watts, 0.01 to 100 megahertz, 0.01 to 10 torr, 0° to 150° C. and 0.1 to 30 min. Preferred ranges are 20 to 500 watts, 0.04 megahertz, 0.02 to 1.0 torr, 25° C. and 5 minutes.

The permeability limiting coating may be about 10 to 10,000, preferably about 200 to 2000, most preferably about 400–1000 angstroms thick.

Plasma deposition of $SiO_x$ films is wholly conventional in the art and further details of this aspect of the invention, while not needed for a complete understanding of the invention, may be found in the aforementioned U.S. Pat. No. 4,552,791 and EP 469,926.

As known in the art, transmission of gas through a plastic article is greatly reduced by an $SiO_x$ or aluminum oxide coating. It has now been found that the coated articles of the invention may be further protected against gas transmission, particularly air, oxygen and carbon dioxide, and gain significantly better shelf time by treatment with ionizing radiation. Thus the polymer, either prior to or subsequent to coating, with or without barrier coating, may be subjected to a total dose of about 0.5 to 12, megarads (Mrads) of radiation from a high energy source such as electron beam radiation or gamma irradiation, such as from a 60° C. source.

It is well known that irradiation of a polymer results in formation of radicals. In accordance with the invention, it has been found that gas transmission through the polymer is reduced because radicals formed in the polymer chain by the radiation react with incoming gas molecules, as illustrated for oxygen by the following scheme:

1) $RH \rightarrow R\cdot + H\cdot$
2) $R\cdot + O_2 \rightarrow RO_2\cdot$
3) $RO_2\cdot + RH \rightarrow R\cdot + ROOH$ (stable hydroperoxide)
4) $RO_2\cdot + RO_2\cdot \rightarrow O_2 + ROOR$ (stable diperoxide)

It is seen that the scheme is auto-oxidative so that one primary radical $R\cdot$ formed by the radiation can neutralize any number of oxygen molecules since it is continually being regenerated. The oxygen is trapped in the polymer as stable peroxide compounds. In practice, one primary radical can consume 100 or more incoming oxygen molecules.

Figure 2:
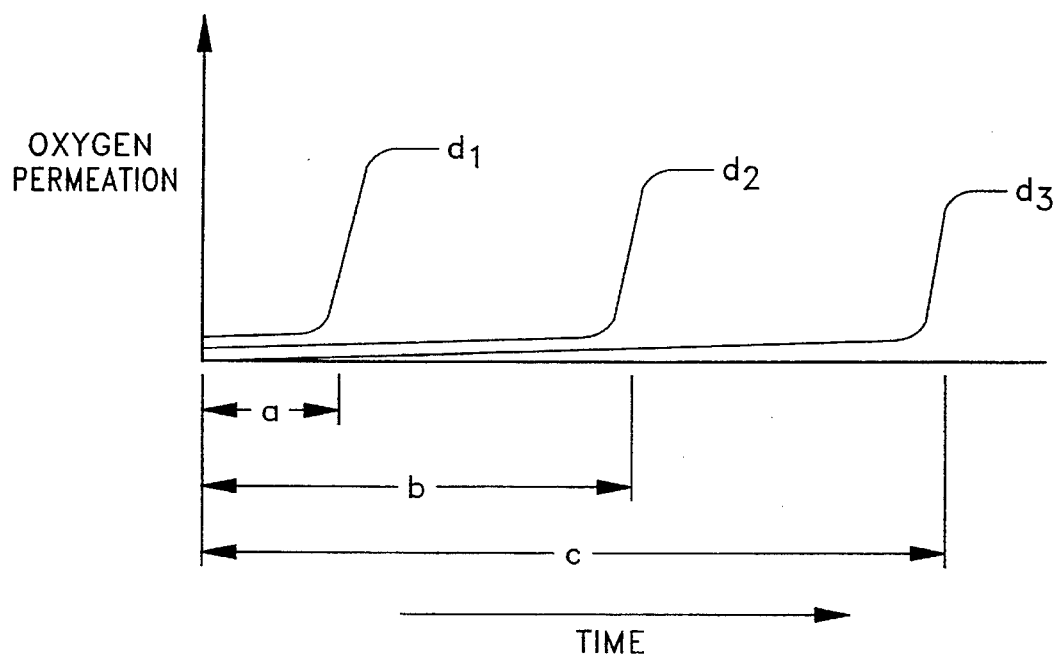
FIG. 2 is a schematic illustration of prolonged time lag to reach steady-state oxygen permeation through a plastic with increased radiation dosage.

It is also well known that the time required to reach steady-state permeation of oxygen through a plastic article (herein referred to as $t_{lag}$) is related to the diffusion constant D and the thickness T of the plastic as set forth in the following equation:

$$t_{lag} = \frac{T^2}{6D}$$

wherein $t_{lag}$, T and D are in sec, cm and cm²/sec respectively. In accordance with the invention, the time lag to reach steady-state permeation is prolonged because incoming oxygen is consumed by the radicals generated by the ionizing radiation, as illustrated schematically in FIG. 2. In FIG. 2, $a$, $b$ and $c$ represent $t_{lag}$ for a plastic irradiated with increasing Mrad dosages $d_1$, $d_2$ and $d_3$ respectively. Increased $t_{lag}$ provides increased shelf life for the irradiated plastic article. Improved shelf life is most evident for articles having a barrier coating to limit the amount of incoming oxygen.

Oxygen transmission through $SiO_x$ coated plastic tubes of the invention was determined before and after irradiation, using an OXTRAN™ instrument (Mocon, Inc.) as described in Example II. In FIGS. 4–8, solid and dotted lines show oxygen transmission before and after irradiation at 10.5 Mrad respectively; in FIG. 9, irradiation was performed at the doses indicated.

Figure 3:
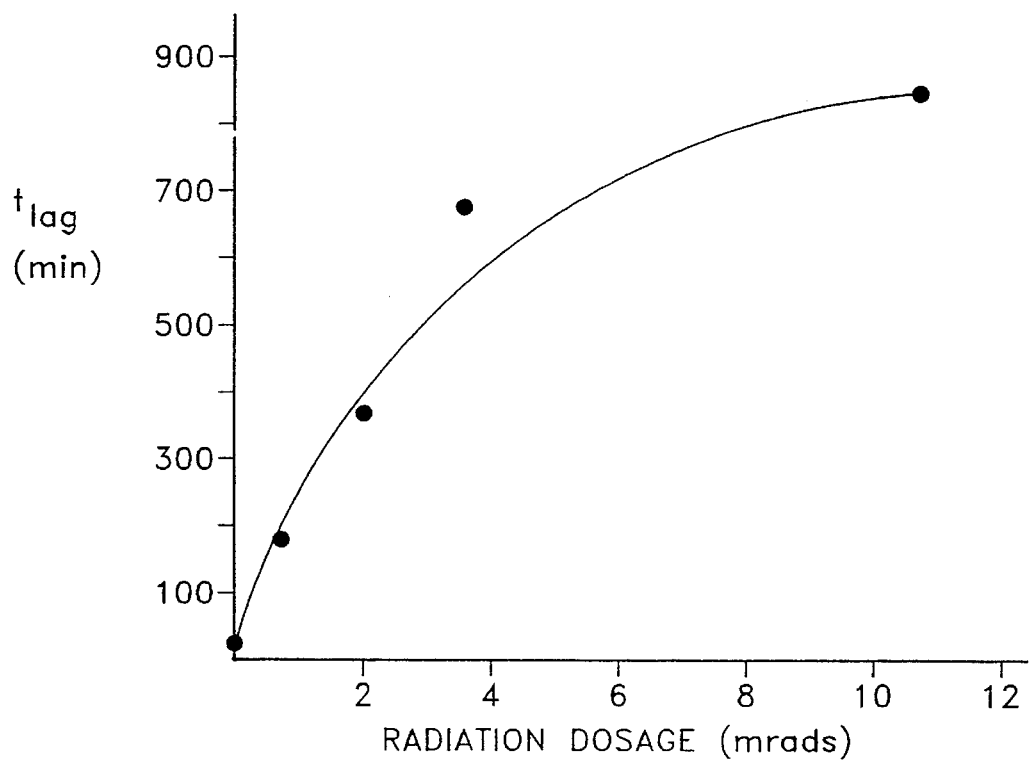
FIG. 3 is a plot showing the relationship of radiation dose to time lag to steady-state oxygen transmission for polyvinylchloride (PVC) film.

In FIG. 3, $t_{lag}$ for irradiated PVC is seen to increase with increasing irradiation dosage.

Figure 4:
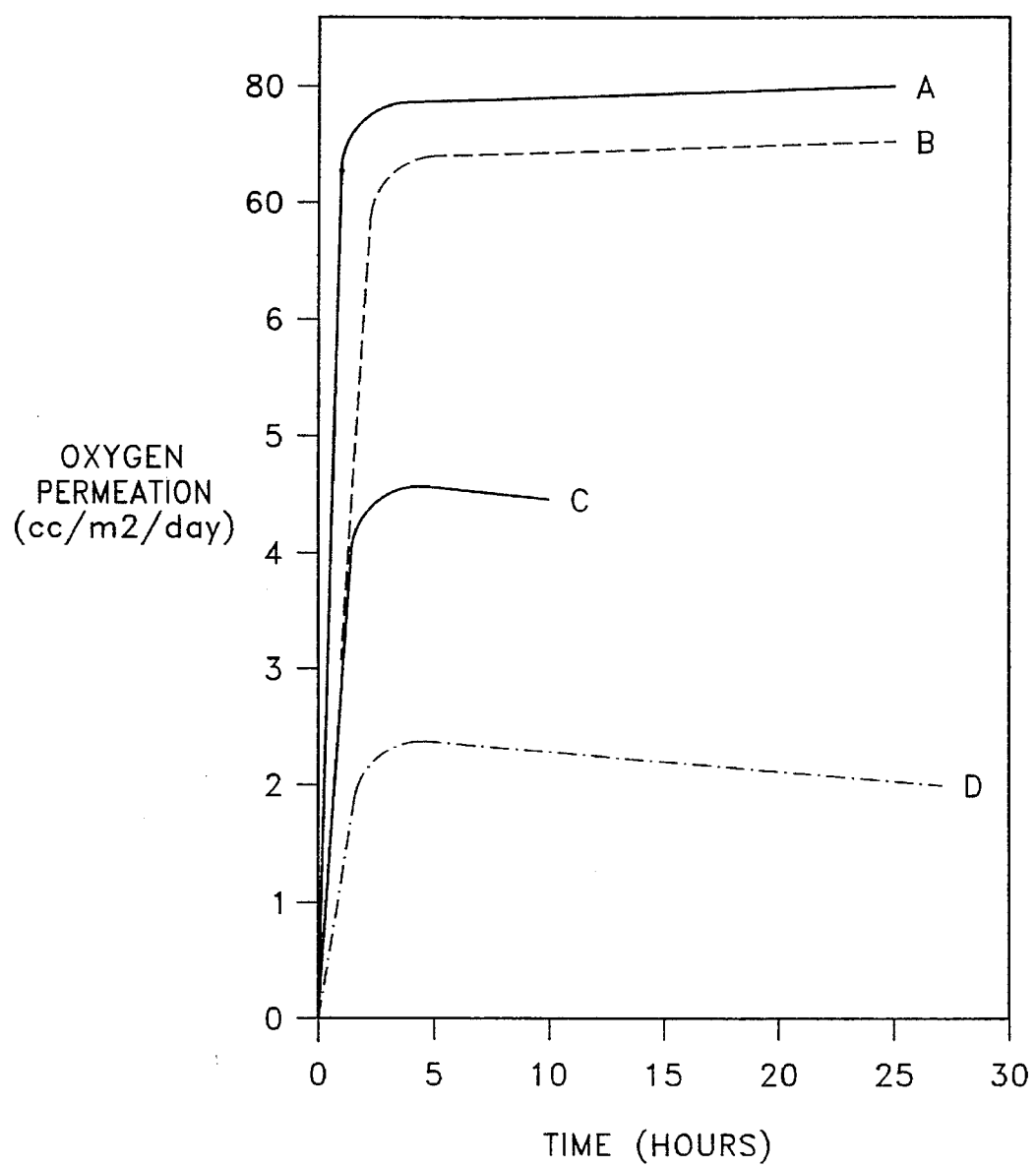
FIGS. 4 and 5 are plots of oxygen permeation vs time for films of PET, with and without barrier coatings and irradiation.
Figure 5:
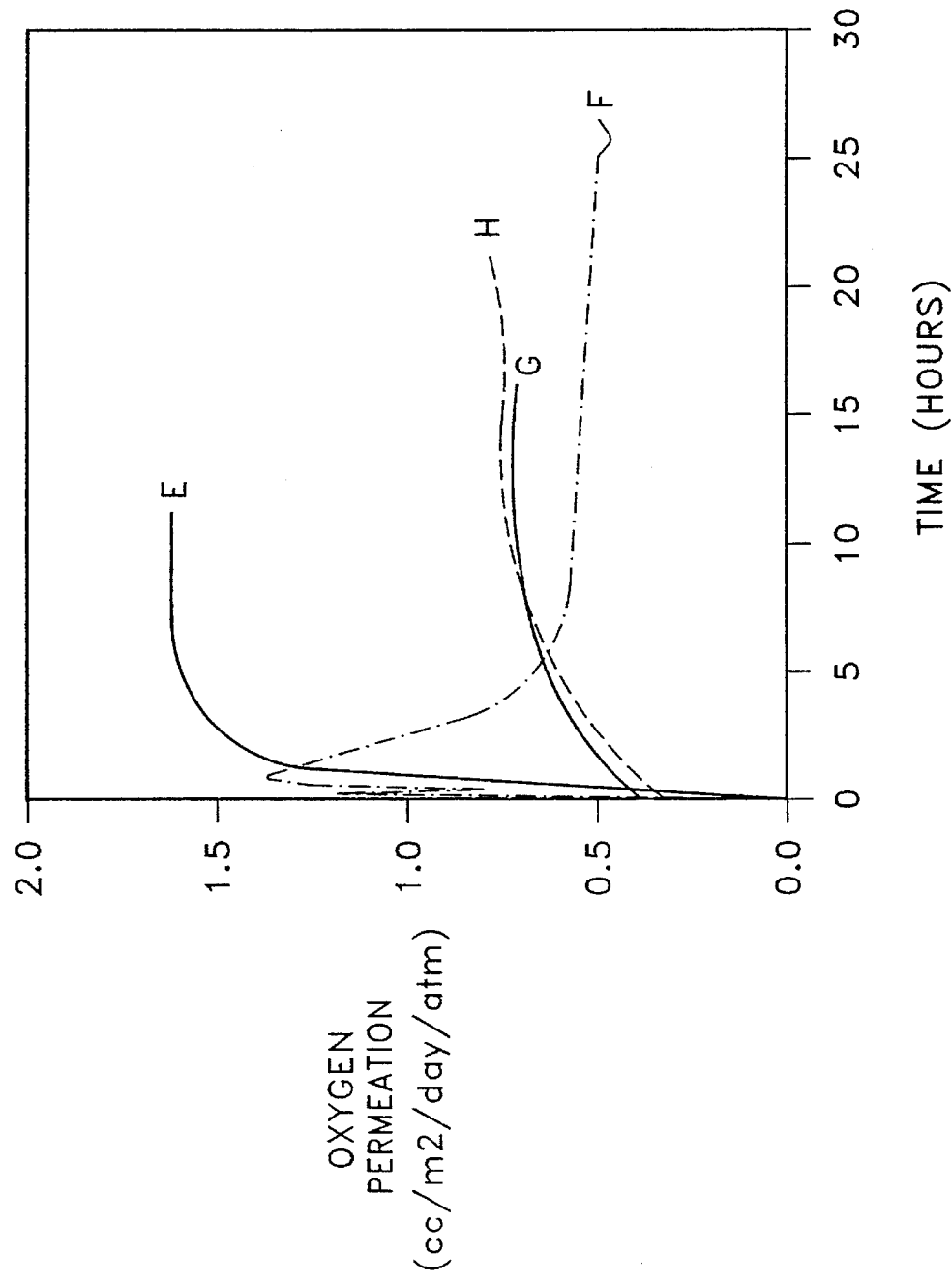

FIGS. 4 and 5 illustrate oxygen transmission through 1 mil (0.0254 mm) thick PET. It is seen (curves A and B) that transmission was somewhat reduced in the absence of irradiation. Curves C and D show that oxygen transmission through 1 mil PET was reduced to 4.5 cc/m²/day/atm by a 300 nm $SiO_x$ film and further reduced to 2.0 cc/m²/day/atm by irradiation. Curves E and F show further improvement by a 450 nm coating of $SiO_x$, but when the barrier was further increased to 600 nm, (curves G and H), no additional decrease in oxygen transmission was noted. Consideration of FIGS. 4 and 5 together shows that irradiation, in addition to providing sterilization, also reduces the thickness of $SiO_x$ required to achieve an optimum level of oxygen transmission, giving obvious economic advantages.

Figure 6:
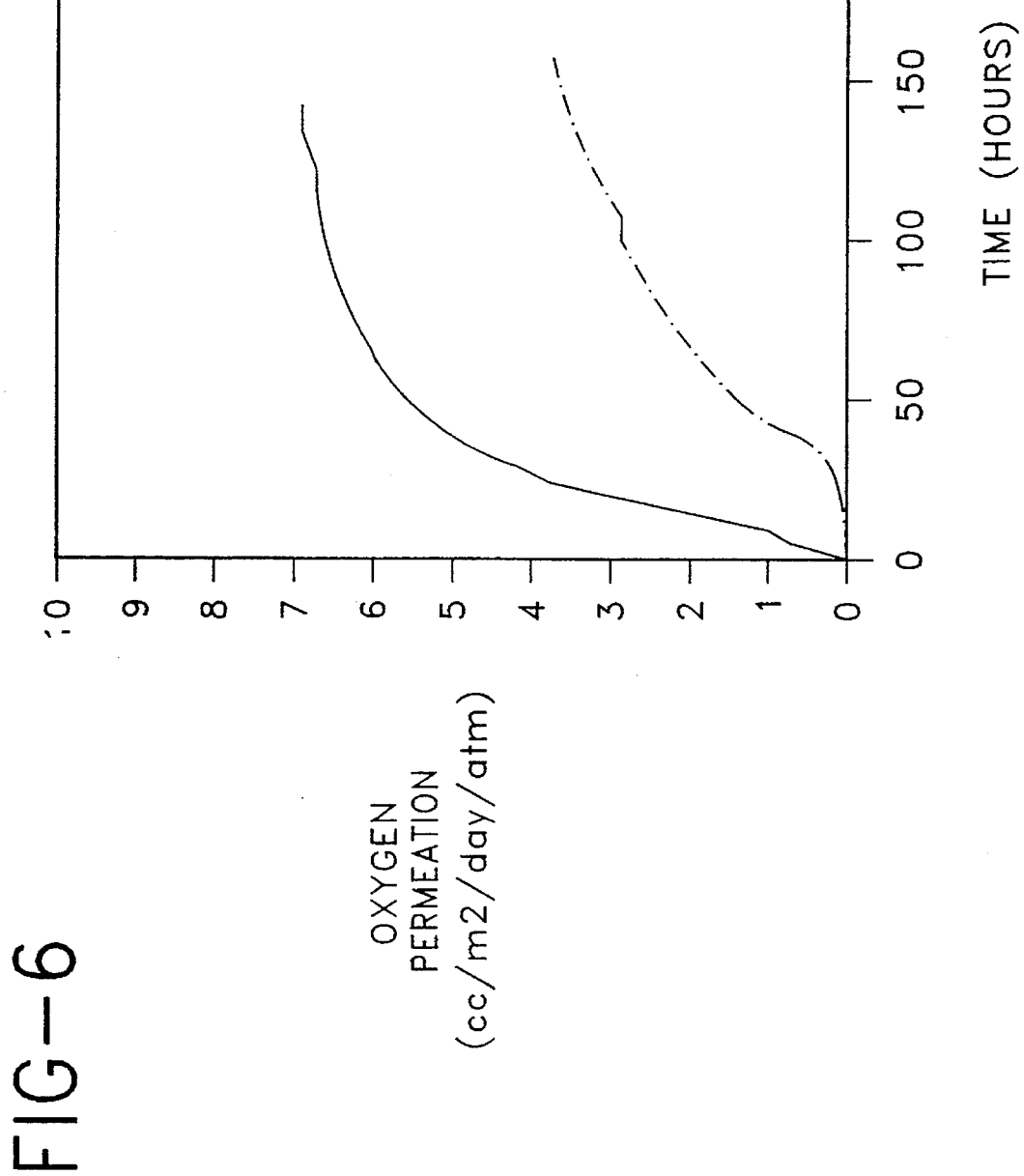
FIG. 6 shows the effect of irradiation on oxygen transmission through PP film barrier coated with $SiO_x$.

FIG. 6 provides data showing the long term beneficial effect of irradiation on $SiO_x$ coated 75 mil (1.9 mm) thick PP. It is seen that, after 150 hrs, the oxygen permeation for irradiated and non-irradiated samples was 3.5 and 7.0 cc/m²/day/atm respectively.

Figure 7:
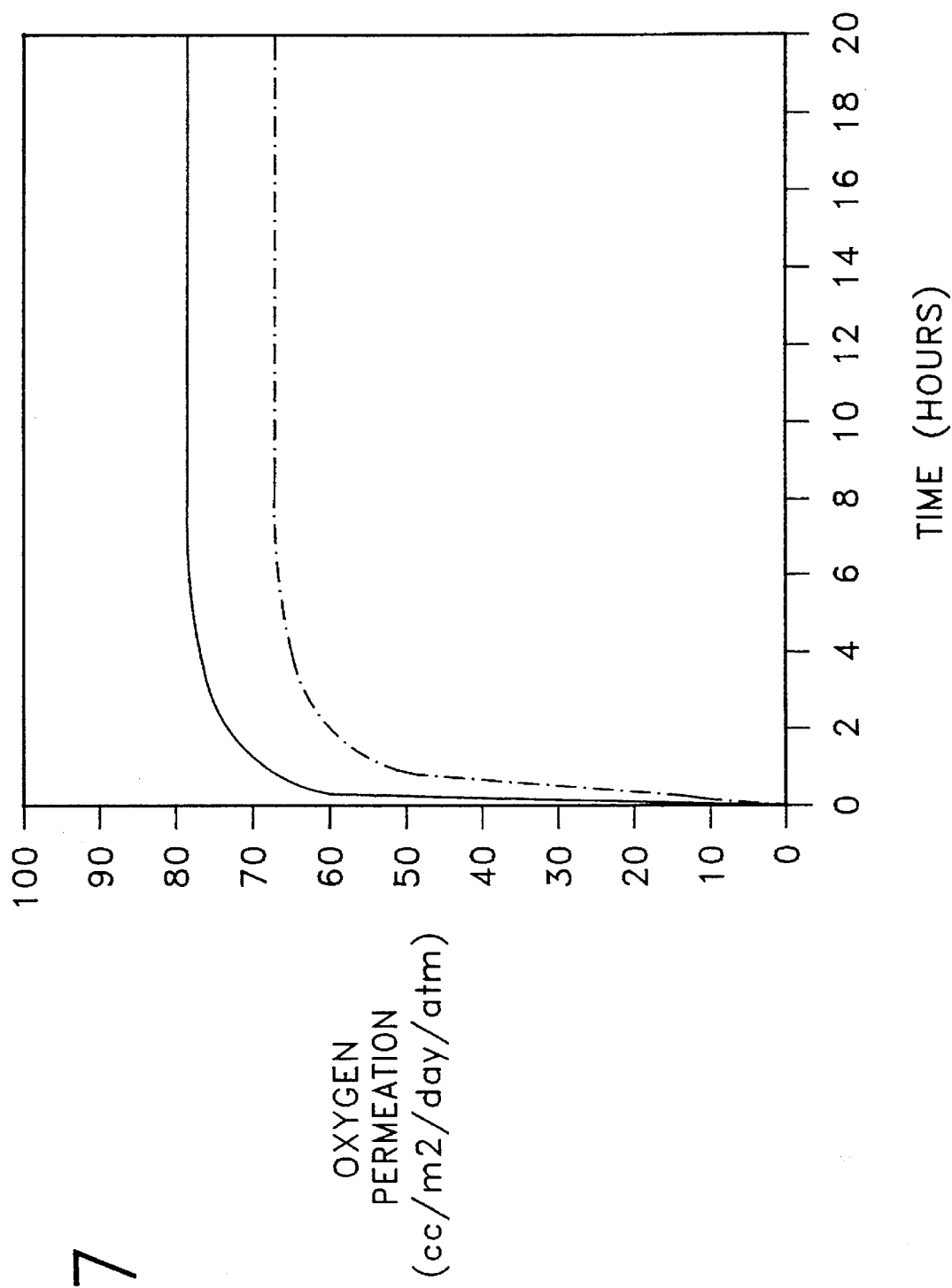
Figure 8:
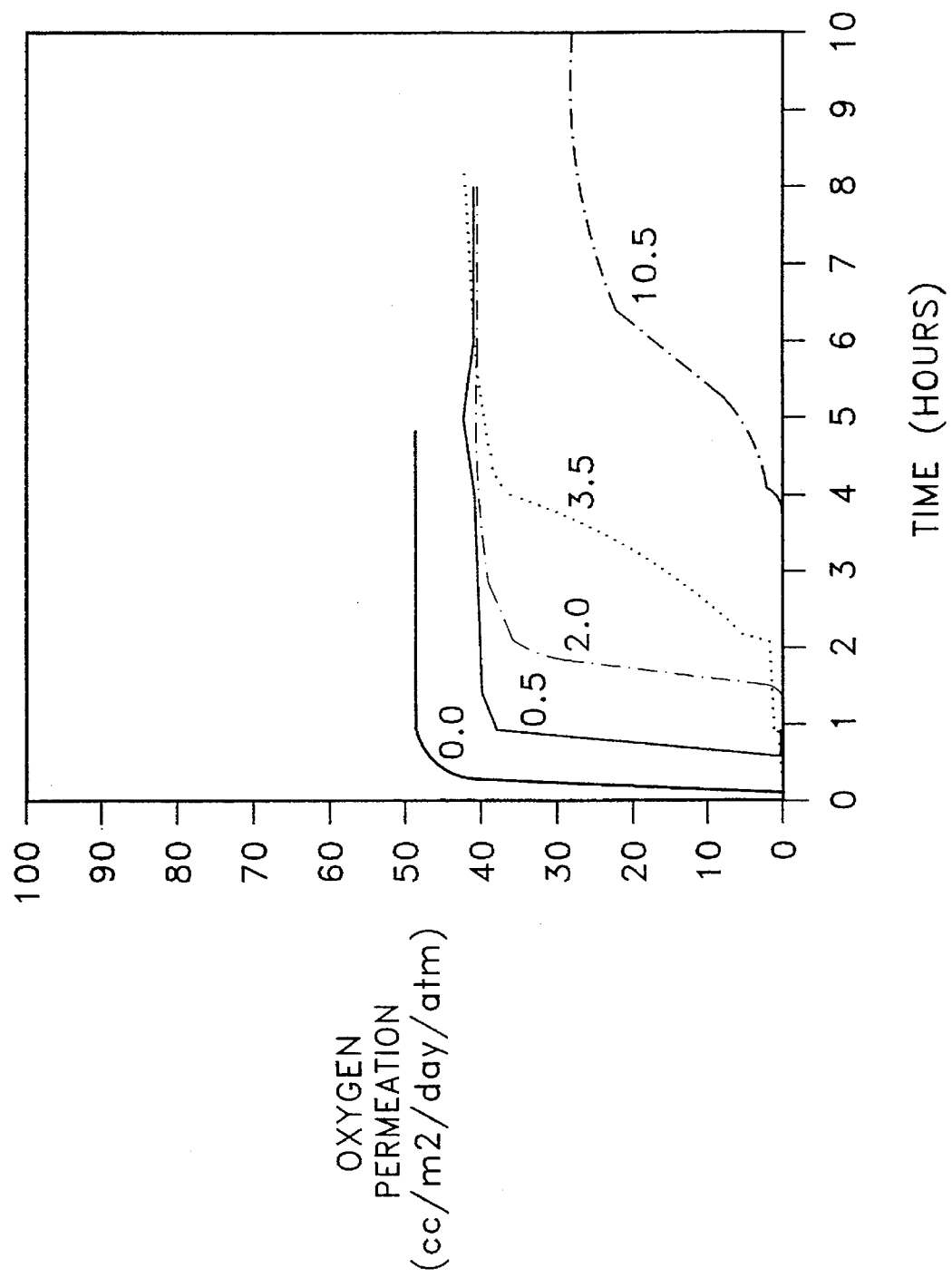

FIG. 7 shows reduced oxygen transmission through 1 mil polyamide (nylon-6) film with and without 10.5 Mrad irradiation. FIGS. 8 and 9 compare the time lag to steady-state transmission for non-irradiated 5 mil PVC film and 1 mil PVDC film with films irradiated with 0.5, 2.0, 3.5 and 10.5 Mrad.

In order to appreciate the improved shelf life achieved by the invention, it must be recognized that $t_{lag}$ gives only the time until steady-state transmission is reached. The actual shelf life is determined by the amount of gas permeating into the article, as given by the area under the curves. Thus, a conventional 2 liter PET soft drink bottle is known to go out of specification in 20 days. Irradiation (10.5 Mrad) alone gives a $t_{lag}$ of 17 days (Table II) This bottle was found to stay within specification for 3 or more months.

EXAMPLE I

GENERAL PROCEDURE FOR COATING A PLASTIC ARTICLE WITH A SILICON OXIDE BASED FILM

An enclosed plasma reaction chamber is evacuated to the desired base pressure. The load lock is vented to atmosphere while the chamber is maintained under high vacuum. Then the load lock is evacuated with the plastic article loaded therein. The chamber pressure is adjusted to a desired value by adjusting the baffle over the diffusion pump. The load lock diffusion pump is closed and the valve isolating the load lock and the chamber is opened. After the pressure in the chamber is stabilized, the power supply is turned on and adjusted to the desired value and a glow discharge plasma is established in the chamber. An emission spectrum from the control program is used to find the appropriate oxygen to inert gas ratio. The organosilicon flow into the chamber is then adjusted until the desired oxygen to inert gas ratio is obtained. The plastic article is then conveyed back and forth through the plasma region until the desired coating thickness is achieved while continuing to monitor the process conditions. Once the desired film thickness is obtained, the system is shut down and the coated tube is removed.

EXAMPLE II

PVC films 5 mil (0.127 mm) thick were gamma irradiated to 0.5, 2.0, 3.5 and 10.5 Mrad. The films were flushed on both sides with nitrogen, and the nitrogen on the upstream side was replaced with 1 atm. of oxygen. Oxygen permeation was measured at 25° using the OXTRAN™ instrument, and $t_{lag}$ was measured at the x-axis intercept. The results are shown in Table 1 below and illustrated in FIG. 3.

TABLE I

| Mrad | $t_{lag}$ (min.) |
|---|---|
| 0 | 20 |
| 0.5 | 186 |
| 2.0 | 384 |
| 3.5 | 678 |
| 10.5 | 852 |

It is clearly seen that increasing radiation dose prolonged the time to reach steady-state permeation.

EXAMPLE III

In the same way as described in Example II, films of various polymers, with and without $SiO_x$ coating, were irradiated to 10.5 Mrad and $t_{lag}$ determined. The results of this experiment are given in Table II below.

TABLE II

| Sample | Thickness (mils) | $t_{lag}$ (min) | $P(O_2)$* | $t_{lag}$** days (40 mil) |
|---|---|---|---|---|
| PVC | 5 | 720 | 50 | 32 |
| Nylon 6 | 1 | 35 | 60 | 39 |

TABLE II-continued

| Sample | Thickness (mils) | $t_{lag}$ (min) | $P(O_2)$* | $t_{lag}$** days (40 mil) |
|---|---|---|---|---|
| PVDC | 0.5 | 62 | 55 | 276 |
| PET | 1 | 15 | 75 | 17 |
| PET ($SiO_x$) | 1 | 23 | 2 | 26 |
| PP ($SiO_x$) | 75 | 2100 | 3 | 3.8 |

* steady-state permeability of oxygen reached (in cc/m²/day/atm)
**$t_{lag}$ for a 40 mil thick polymer calculated from the data above and the equation.

EXAMPLE IV

In the same way as described in Example II, PVDC films 1 mil (0.025 mm) thick were irradiated and oxygen permeation measured. The results are shown in Table III below and illustrated in FIG. 8.

TABLE III

| Mrad | $t_{lag}$ (min.) |
|---|---|
| 0 | 20 |
| 0.5 | 36 |
| 2.0 | 90 |
| 3.5 | 138 |
| 10.5 | 288 |

It is clearly seen that increasing radiation dose prolonged the time to reach steady-state permeation.

What is claimed is:

1. A method to improve the shelf life of a plastic article comprising depositing a coating of silicon oxide on a surface of a plastic article and subjecting the coated surface to high energy irradiation whereby shelf life is improved by reduced gas transmission through said plastic.

2. The method of claim 1 wherein said gas is selected from the group consisting of air, oxygen, carbon dioxide and water vapor.

3. A method to reduce gas transmission through the wall of a plastic sample collection tube comprising:
   a) exposing a plastic sample collection tube to high energy radiation to form a free radical in said plastic; and
   b) allowing said radical to react with an oxygen molecule, thereby preventing said molecule from passing through said plastic into said tube.

4. The method of claim 3 wherein said tube is an evacuated blood collection tube.

* * * * *